United States Patent [19]
Lee et al.

[11] Patent Number: 5,812,073
[45] Date of Patent: Sep. 22, 1998

[54] METHOD AND APPARATUS FOR GENERATING RUN-LENGTH LIMITED CODE

[75] Inventors: Jae-hong Lee; Min-goo Kim, both of Seoul; Kwang-man Ok; Yoon-woo Lee, both of Kyungki-do, all of Rep. of Korea

[73] Assignee: Samsung Electronics Co., Ltd., Kyungki-Do, Rep. of Korea

[21] Appl. No.: 510,140

[22] Filed: Jul. 31, 1995

[30] Foreign Application Priority Data

Nov. 29, 1994 [KR] Rep. of Korea .................. 94-31848

[51] Int. Cl.[6] ................................................. H03M 7/00
[52] U.S. Cl. ................................ 341/59; 341/61; 341/67
[58] Field of Search ............................ 341/59, 61, 67

[56] References Cited

U.S. PATENT DOCUMENTS

| | | |
|---|---|---|
| 4,675,650 | 6/1987 | Coppersmith et al. .......... 340/347 DD |
| 4,804,959 | 2/1989 | Makansi et al. .................... 341/59 |
| 4,985,700 | 1/1991 | Mikami ............................... 341/59 |
| 5,173,694 | 12/1992 | Lynch, Jr. et al. ................. 341/59 |
| 5,175,545 | 12/1992 | Uchiyama et al. ................. 341/59 |
| 5,349,350 | 9/1994 | Blagaila ............................. 341/59 |
| 5,537,112 | 7/1996 | Tsang ................................. 341/59 |
| 5,635,933 | 6/1997 | Fitzpatrick et al. ................ 341/58 |
| 5,682,155 | 10/1997 | McLaughlin ....................... 341/59 |

*Primary Examiner*—Jeffrey A. Gaffin
*Assistant Examiner*—Jason L. W. Kost
*Attorney, Agent, or Firm*—Cushman Darby&Cushman IP Group of Pillsbury Madison & Sutro LLP

[57] ABSTRACT

A method and an apparatus are provided for generating an (4,20) RLL modulation code having a decreased detectible window width and an increased recording density ratio. The code's spectrum is concentrated in the low-frequency band, thereby improving the signal-to-noise ratio. In addition, the hardware of an encoder and a decoder can be easily implemented since the modulation code has a fixed codeword length.

7 Claims, 6 Drawing Sheets

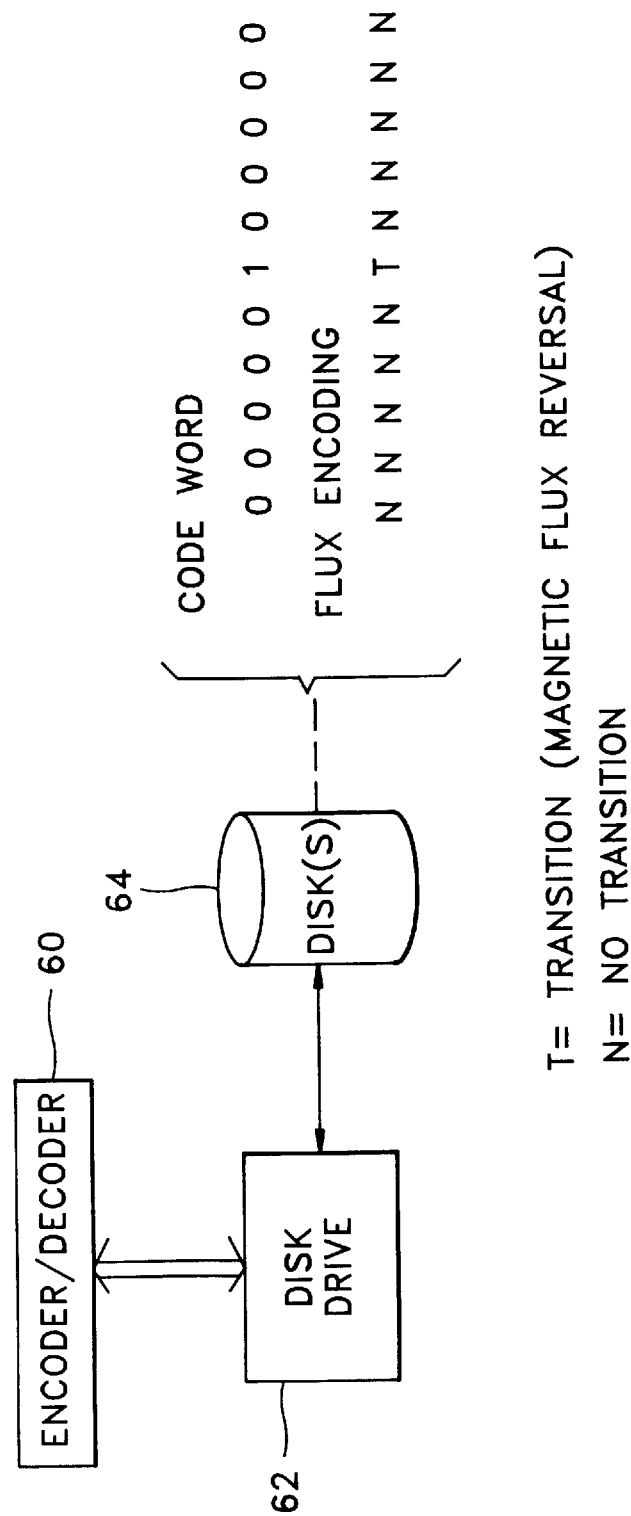

METHOD AND APPARATUS FOR GENERATING RUN-LENGTH LIMITED CODE

BACKGROUND OF THE INVENTION

The present invention relates to a method and apparatus for generating a run-length limited (RLL) code useful in a magneto-optical disk system, and more particularly, to a method and apparatus for generating (4,20) RLL code whose sequences comprise a minimum of four zeros and a maximum of twenty zeros between two successive 1's, and for mapping four data bits into eleven code bits.

There has been much research into high density recording data on recording media (e.g., magnetic tape and magnetic or magneto-optical disks) resulting in the development of, among other techniques, various RLL codes. An RLL code has a predetermined number of zeros between two successive 1's of a code bit sequence. Here, expressed as a (d,k) RLL code, the number of zeros should be a minimum of "d" for preventing inter-symbol interference and a maximum of "k" for self-clocking. Such a (d,k) RLL code maps m data bits into n code bits, wherein m is less than n and a density ratio is defined as m(d+1)/n.

A (1,7) RLL modulation code is close to the channel capacity limit, meaning that it is very effective. Here, the density ratio of the (1,7) RLL modulation code is 4/3, which is suitable for magnetic tape or magnetic disc but is a somewhat low recording density for a magneto-optical disk system.

Meanwhile, a variable five modulation (VFM) code for a Sony compact disk (CD) system is a (4,22,2,5;5) RLL modulation code having a variable codeword length whose encoding ratio is 2/5 and whose density ratio is 2.0. In this case, the channel cutoff frequency is increased to nearly twice that of a conventional CD system by using a second harmonic generation green laser (whose wavelength is shorter than that of a conventional laser) and a high numeric aperture lens, so as to compensate for a reduction of the detectable window width due to the increase of "d." The problems caused by the reduction in the detectable window width are solved by using a high-performance (i.e., high signal-to-noise ratio) equalizer and detector in the CD system. However, since the VFM code is a modulation code having a variable codeword length and since modulation codes for reproduction should have a high signal-to-noise ratio, the VFM code is not suitable for a magneto-optical disk system for recording and reproduction. Also, since this modulation code has a variable codeword length, hardware implementation is difficult.

Thus, the demodulation code for the magneto-optical disk system should be a new form, compensating for the drawbacks of both the (1,7) and (4,k) RLL modulation codes, and should reflect the channel frequency characteristics of a magneto-optical disk system.

SUMMARY OF THE INVENTION

To overcome the drawbacks of the (1,7) RLL code and VFM modulation code, it is an object of the present invention to provide a method for generating a (4,20) RLL code, in which encoder/decoder hardware can be easily realized by increasing the density ratio to 20/11 and adopting a modulation code having a fixed codeword length.

It is another object of the present invention to provide an apparatus suitable for the above method for generating an RLL code.

To achieve one object of the present invention, a method is provided for generating RLL modulation code having bit sequences which include a minimum of four zeros and a maximum of twenty zeros between two successive 1's. A sequence of four bit source data is encoded by converting the source data into a sequence of eleven bit channel data and storing the result in predetermined recording media. The 11-bit channel data sequence is reproduced from the recording media by converting the channel data into the 4-bit source data sequence.

To achieve another objects of the present invention, an apparatus is provided for generating RLL modulation code having bit sequences which include a minimum of four zeros and a maximum twenty zeros between two successive 1's. An encoder is provided for converting a 4-bit source data sequence into an eleven bit channel data sequence for storing the result in predetermined recording media. A decoder is provided for converting the 11-bit channel data sequence supplied from said recording media into the 4-bit source data sequence.

BRIEF DESCRIPTION OF THE DRAWINGS

The above objects and advantages of the present invention will become more apparent by describing in detail a preferred embodiment thereof with reference to the attached drawings in which:

FIG. 6 illustrates a storage subsystem utilizing an encoder/decoder system such as the one illustrated in FIG. 1.

DETAILED DESCRIPTION OF THE INVENTION

Figure 1:
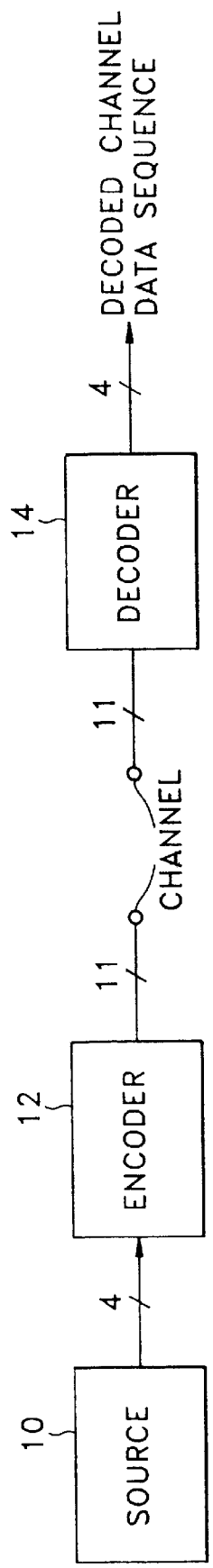
FIG. 1 is a block diagram schematically showing the construction of a (4,20) RLL code generator according to the present invention.

To obtain an RLL modulation code, the encoding ratio m/n of the modulation code should be less than the channel capacity of the modulation code, and particularly, the modulation code whose encoding ratio is equal to the channel capacity is optimum. However, it is difficult to obtain a modulation code whose encoding ratio is close to the channel capacity, since the modulation code has a variable codeword length and also has an encoding ratio which is a rational number. That is, in the case of an obtainable modulation code, its encoding ratio should be an integer and the modulation code should have a fixed codeword length. If the channel capacity (C) of a (d,∞) RLL modulation code is 0.4056, then the encoding ratio that satisfies the condition d-4 is 4/10, 4/11, 4/12, etc.

Table 1 is an encoding table of (4,20) RLL modulation code which is composed of 11 bit codewords and satisfies the condition that d is equal to 4 in a single codeword.

TABLE 1

| input | codeword (No.) |
|---|---|
| 0000 | 00000 100000 (c1) |
| 0001 | 00001 000000 (c2) |
| 0010 | 00010 000000 (c3) |
| 0011 | 00100 000000 (c4) |
| 0100 | 01000 000000 (c5) |
| 0101 | 10000 000000 (c6) |
| 0110 | 00010 000100 (c7) |
| 0111 | 00100 001000 (c8) |
| 1000 | 00000 001000 (c9) |
| 1001 | 10000 100000 (c10) |
| 1010 | 00100 000100 (c11) |
| 1011 | 01000 001000 (c12) |
| 1100 | 00000 000100 (c13) |
| 1101 | 01000 000100 (c14) |
| 1110 | 10000 001000 (c15) |
| 1111 | 10000 000100 (c16) |

The codewords shown in Table 1 each satisfy the condition that d is equal to 4 in one codeword. However, when different codewords are connected, the condition d-4 may not be satisfied. Table 2 represents a replacement table to be used in three cases in which the condition (d=4) is not satisfied. That is, the given codeword sequences are replaced with new codeword sequences by using the replacement table. In Table 2, if two codewords $C_i$ and $C_j$ are connected, pk ($1 \leq k \leq 11$) represents the location of each bit forming a preceding codeword $C_i$ (referred to herein as a codeword P) and sl ($1 \leq l \leq 11$) represents the location of each bit forming a succeeding codeword $C_j$ (referred to herein as a codeword S).

TABLE 2

| previous sequence<br>p7,p8,p9,p10,p11,s1,s2,s3 | translated sequence<br>p*7,p*8,p*9,p*10,p*11,s*1,s*2,s*3 |
|---|---|
| (1) X X 1 0 0 : 0 1 X | X X 0 0 1 : Rule I |
| (2) X X 1 0 0 : 1 X X | X X 0 1 0 : Rule II |
| (3) 0 1 0 0 0 : 1 X X | 1 0 0 0 0 : Rule III-1, III-2 |

On the other hand, each replacement rule of Table 2 is as follows.

< Rule I >
p9, p10, p11: 1 0 0 → 0 0 1

| | s1 . . . s11 | | s*1 . . . s*11 |
|---|---|---|---|
| c5: | 01000 000000 | → | 00001 000000 |
| c12: | 01000 001000 | → | 00000 100000 |
| c14: | 01000 000100 | → | 00000 010000 |

< Rule II >
p9, p10, p11: 1 0 0 → 0 1 0

| | s1 . . . s11 | | s*1 . . . s*11 |
|---|---|---|---|
| c6: | 10000 000000 | → | 00010 000000 |
| c10: | 10000 100000 | → | 00001 000000 |
| c15: | 10000 001000 | → | 00000 100000 |
| c16: | 10000 000100 | → | 00000 010000 |

< Rule III-1 > for p3=0
p7, p8, p9, p10, p11: 0 1 0 0 0 → 1 0 0 0 0

| | s1 . . . s11 | | s*1 . . . s*11 |
|---|---|---|---|
| c6: | 10000 000000 | → | 01000 000000 |
| c10: | 10000 100000 | → | 00100 000000 |
| c15: | 10000 001000 | → | 00010 000000 |
| c16: | 10000 000100 | → | 00001 000000 |

< Rule III-2 > for p3=1
p7, p8, p9, p10, p11: 0 1 0 0 0 → 1 0 0 0 0
p3: 1 → 0

| | s1 . . . s11 | | s*1 . . . s*11 |
|---|---|---|---|
| c6: | 10000 000000 | → | 10000 100000 |
| c10: | 10000 100000 | → | 10000 010000 |
| c15: | 10000 001000 | → | 00000 100000 |
| c16: | 10000 000100 | → | 00000 010000 |

FIG. 1 is a block diagram schematically showing the construction of a (4,20) RLL code generator according to the present invention.

The RLL code generator shown in FIG. 1 is schematically composed of a source 10, an encoder 12 and a decoder 14.

During operation of the RLL code generator having a above construction, the data sequence is supplied from source 10, four-bit units to encoder 12 and then changed into a channel data sequence of 11 bits in encoder 12. Here, the channel data sequence satisfies the condition that d is equal to 4 and k is equal to 20. This channel data sequence is reproduced after being recorded in storage media such as a magneto-optical disk, and the reproduced channel data sequence of 11 bits is provided to decoder 14 and then changed into a source data sequence of 4 bits in decoder 14.

Figure 2:
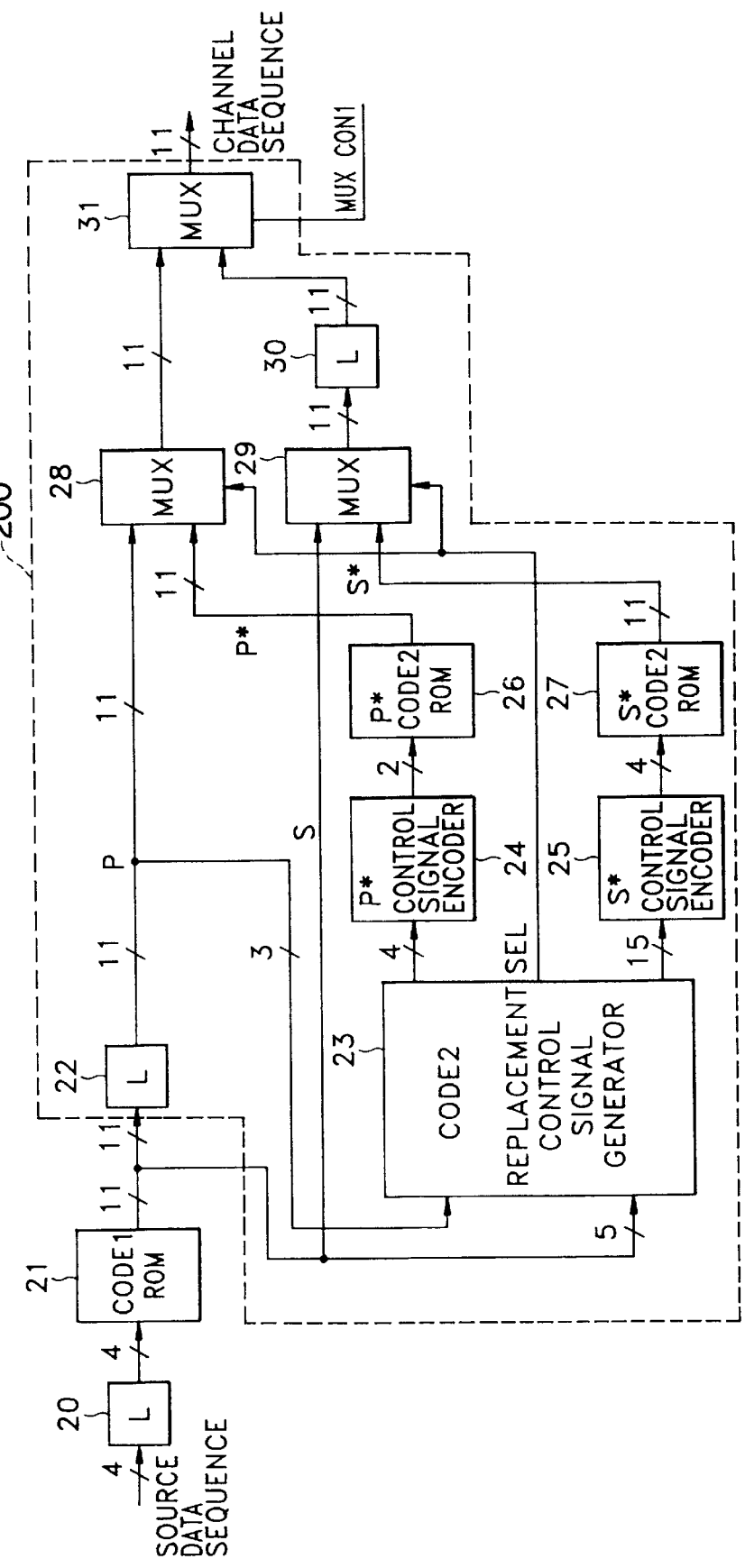
FIG. 2 is a detailed block diagram of the encoder shown in FIG. 1.

FIG. 2 is a detailed block diagram of the encoder 12 shown in FIG. 1. The encoder comprises modulating means, i.e., a code1 ROM 21, for modulating an input source data sequence of 4 bits into channel data codeword S of 11 bits, and codeword replacing means 200 for replacing the codeword according to a predetermined replacement rule by examining whether an 11-bit channel data codeword modulated in code1 ROM 21 satisfies the condition (d=4) and outputting the result.

Also, codeword replacing means 200 comprises latches (L) 22 and 30, a code2 replacement control signal generator 23, a P* control signal encoder 24, an S* control signal encoder 25, a P* code2 ROM 26, an S* code2 ROM 27, and first to third multiplexers 28, 29 and 31.

Figure 3:
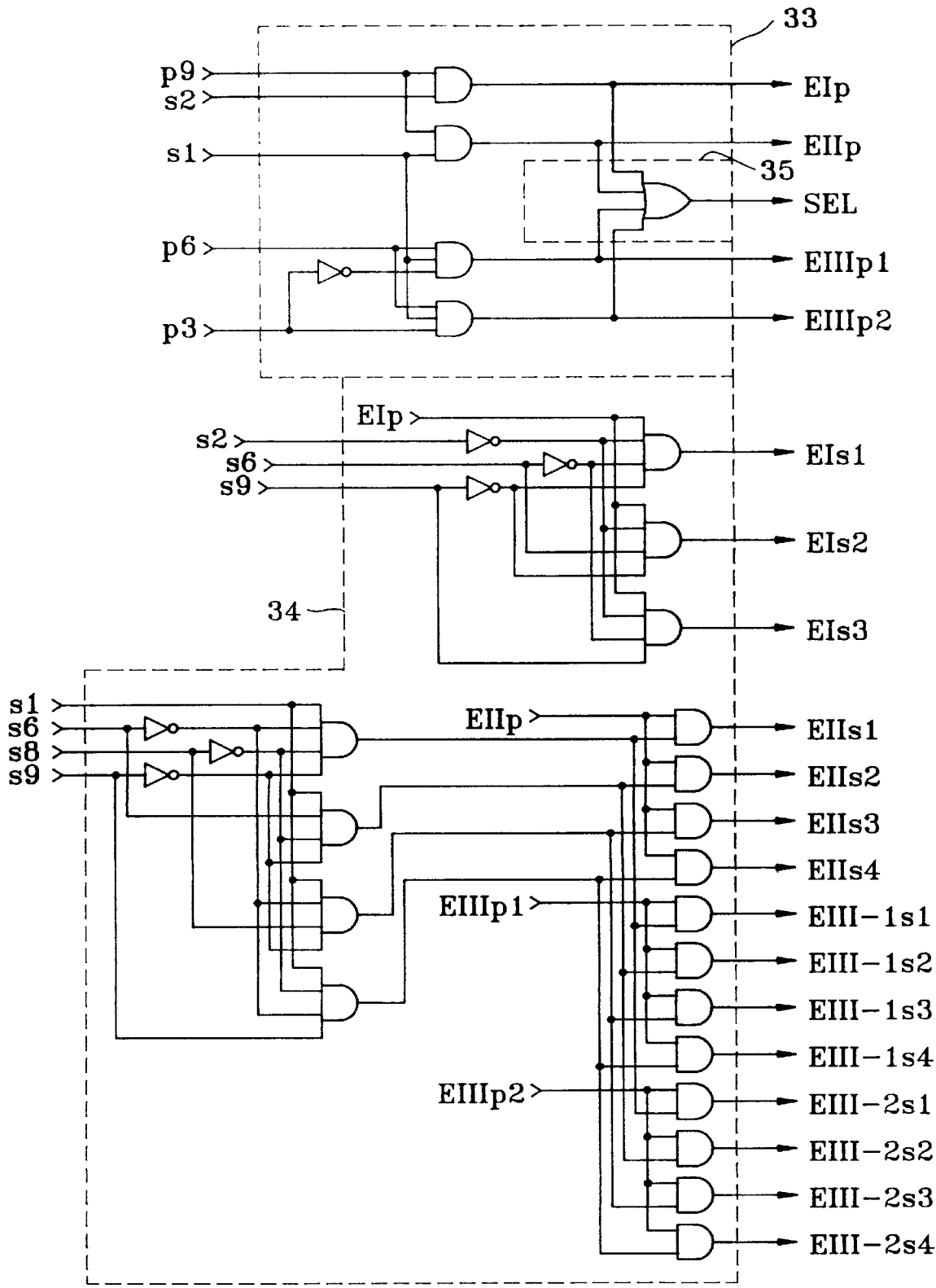
FIG. 3 is a detailed circuit diagram of the replacement control signal generator for replacing a code of the encoder shown in FIG. 2, whose d value is not equal to 4, with code2.

FIG. 3 is a detailed circuit diagram of a replacement control signal generator 23 for replacing a code of encoder 12 shown in FIG. 2, whose d value is not equal to 4, with code2 which acts as a replacement code. Replacement control signal generator 23 is composed of a P code control signal generator 33, an S code control signal generator 34, and a selection signal generator 35.

Figure 4:
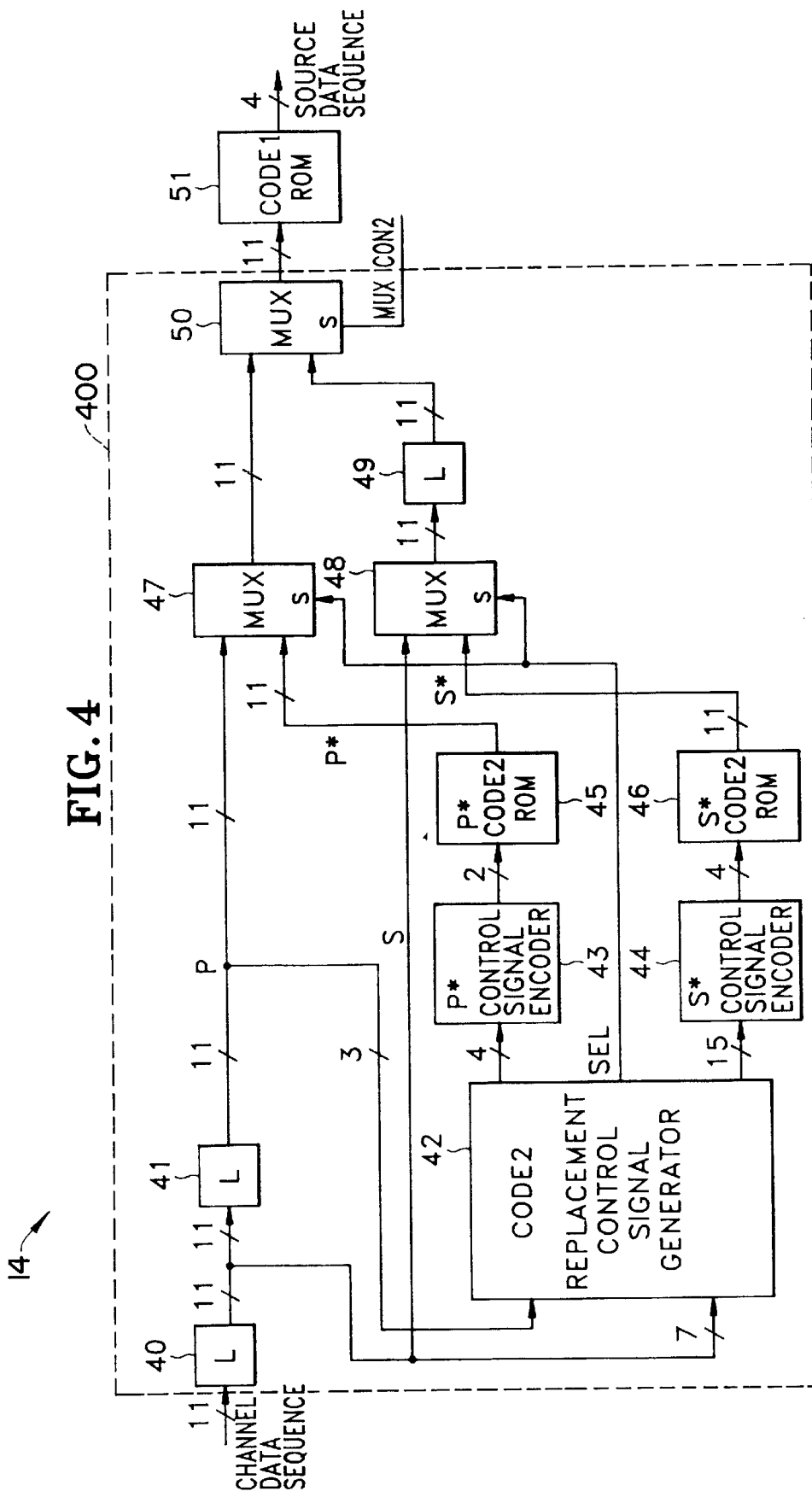
FIG. 4 is a detailed block diagram of the decoder shown in FIG. 1.

FIG. 6 illustrates a storage sub-system utilizing an encoder/decoder system such as the one illustrated in FIGS. 2–4. The storage system comprises an RLL encoder/decoder 60, a storage drive (illustrated as a disk drive) 62, and a storage medium 64, which may comprise, e.g., computer storage disks. More particularly, the storage medium may comprise magneto-optical disks.

Figure 5:
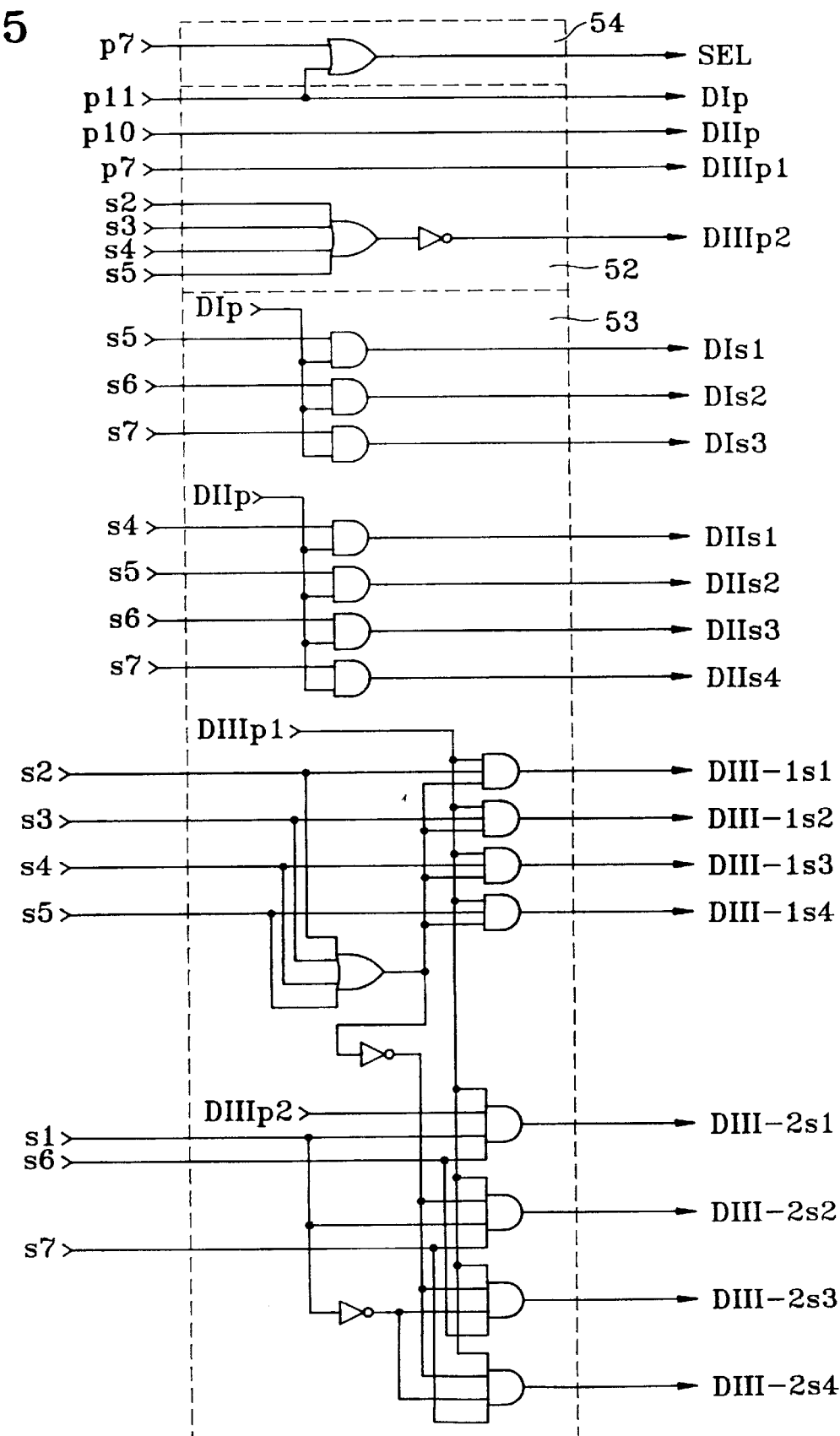
FIG. 5 is a detailed block diagram of the replacement control signal generator for replacing the replacement code of the decoder shown in FIG. 4 with the original code2.

Encoder/decoder 60 is coupled to storage drive 62, which is in turn coupled to storage medium 64. Binary signals may be stored (written) to and retrieved (read) from the storage medium by physically recording 0's and 1's on the storage medium. In the case of a magnetic storage medium (e.g., magnetic or magneto-optical), binary information is physically stored by placing flux transitions at certain spaced locations along a track of a disk. FIG. 5 shows, by way of example, the magnetic pattern (with T standing for a flux transition and N standing for an absence of a flux transition) corresponding to an 11 bit codeword (encoded according to Table 1, above).

Referring to FIGS. 2 and 3, the operation of encoder 12 shown in FIG. 1 will be described below.

In FIG. 2, the input source data sequence of 4 bits is modulated into a channel data codeword S of 11 bits as it passes through code1 ROM 21 via latch 20, and the channel data codeword S is provided to code2 replacement control signal generator 23 and second multiplexer 29. Latch 20 is used to synchronize the 4 bit source data applied to code1 ROM 21. On the other hand, channel data codeword P of 11 bits is output by latch 22 and is provided to code2 replacement control signal generator 23 and first multiplexer 28. Latch 22 is used to delay 11 bit channel data codewords that are output by code1 ROM 21.

The input source data sequence contains a sequence of 4 bit words of data. Suppose it contained a sequence of 4 bit words called ABCDEFG, the first in the sequence being a 4-bit word A, the next in the sequence being a 4-bit word B, and so on. The encoding circuit of FIG. 2 takes the first 4-bit word A and converts it into an 11 bit (preceding) codeword P and takes the second 4-bit word B and converts it into an 11 bit (succeeding) codeword S, and so on. The result would be that 4 bit words ABCDEFG would become 11 bit words, with A, C, E, and G corresponding to 11 bit codewords P, and with B, D, and F corresponding to 11 bit codewords S.

Code2 replacement control signal generator 23 examines channel data codeword S output from code1 ROM 21 and channel data codeword P output from latch 22, and determines whether there are five bits among the 11 bit codewords that do not satisfy the condition of d=4. It then outputs channel data codeword S if all codewords satisfy the condition. If there is a codeword which does not satisfy the condition d-4, code2 replacement control signal generator 23 generates the control signals for replacing the codewords according to the replacement rules shown in Table 2.

Referring to FIG. 3, code2 replacement control signal generator 23 will be described in detail. P code control signal generator 33 generates control signals EIp, . . . , EIIIp2 for replacing a P code, and S code control signal generator 34 generates the control signals EIs1, . . . , EIII-2s4 for replacing an S code. Selection signal generator 35 generates a selection signal (SEL) according to whether the channel data codeword S output from code1 ROM 21 and channel data codeword P output from latch 22 are satisfy the condition that d is not equal to four, and applies the selection signal to first and second multiplexers 28 and 29.

The control signals generated from code2 replacement control signal generator 23 are encoded by P* control signal encoder 24 and S* control signal encoder 25 and then input to the addresses of P* code2 ROM 26 and S* code2 ROM 27.

The replacement codewords read out from P* code2 ROM 26 and S* code2 ROM 27 with respect to each address are applied to first and second multiplexers 28 and 29, respectively.

First multiplexer 28 selects one of between channel data codeword P output from latch 22 and channel data codeword P* output from P* code2 ROM 26 according to the selection signal output from code2 replacement control signal generator 23, and outputs the selected codeword to third multiplexer 31.

Second multiplexer 29 selects one of between channel data codeword S output from code1 ROM 21 and channel data codeword S* output from S* code2 ROM 27 according to the selection signal output from code2 replacement control signal generator 23, and outputs the selected codeword to third multiplexer 31 via latch 30. Latch 30 is used to delay 11 bit channel data codewords that are output by multiplexer 29.

It is noted that each of latches 20, 22, and 30 may be implemented as a register sensitive to pulse duration (e.g., a gated D-type latch) and/or a register sensitive to pulse transition (e.g., an edge-triggered or master-slave flip flop).

Third multiplexer 31 selects one of between P code output from first multiplexer 28 and S code output from latch 30, and outputs the selected code as channel data sequence of eleven bits. The control inputs to MUX 31 and MUX 50 receive timing signals indicating the appropriate time to output either a codeword P (e.g., A) in the output sequence or a codeword S (e.g., B) in the output sequence.

FIG. 4 is a detailed block diagram of decoder 14 shown in FIG. 1. Decoder 14 comprises of codeword replacing means 400 for replacing the replaced codeword with the original codeword if there is a replaced code after examining whether channel data codeword of eleven bits has a code replaced by a predetermined replacement rule and outputting the result, and modulating means, i.e., a code1 ROM 51, for modulating a source data sequence of eleven bits output from codeword replacing means 400 a into source data codeword of four bits.

Also, codeword replacing means 400 comprises latches (L) 40, 41 and 49, a code2 replacement control signal generator 42, a P* control signal encoder 43, an S* control signal encoder 44, a P* code2 ROM 45, an S* code2 ROM 46, and first to third multiplexers 47, 48 and 50.

FIG. 5 is a detailed block diagram of replacement control signal generator 42 for replacing the replacement code of the decoder shown in FIG. 4 with the original code2. Here, control signal generator 42 is composed of a P code control signal generator 52, an S code control signal generator 53, and a selection signal generator 54.

Referring to FIGS. 4 and 5, the operation of decoder 14 shown in FIG. 1 will be described below.

In FIG. 4, an 11-bit channel data sequence reproduced from storage media (not shown) is provided, via latch 40, to code2 replacement control signal generator 42 and second multiplexer 48. On the other hand, channel data codeword P which has been passed through latch 41 is provided to code2 replacement control signal generator 42 and first multiplexer 47.

Code2 replacement control signal generator 42 examines seven bits of channel data codeword S output from latch 40 and channel data codeword P output from latch 41 to determine whether those codewords are codes replaced by a Rule from Rule I to Rule III-2 shown in Table 2. If a codeword is determined to be a replaced code, code2 replacement control signal generator 42 generates the control signals for replacing the codewords with an original code.

Referring to FIG. 5, code2 replacement control signal generator 42 will be described in detail. P code control signal generator 52 generates control signals DIp, . . . , DIIIp2 for replacing a P code, and S code control signal generator 53 generates control signals DIsI, . . . , DIII 2s4 for replacing an S code. Selection signal generator 54 generates a selection signal (SEL) according to whether seven bits of channel data codeword S output from latch 40 and channel data codeword P output from latch 41 are replaced by each Rule from Rule I to Rule III-2 shown in Table 2, and applies the selection signal to first and second multiplexers 47 and 48.

The control signals generated from code2 replacement control signal generator 42 are encoded by P* control signal encoder 43 and S* control signal encoder 44 and then input to the addresses of P* code2 ROM 45 and S* code2 ROM 46.

The replacement codewords read out from P* code2 ROM 45 and S* code2 ROM 46 with respect to each address are applied to first and second multiplexers 47 and 48, respectively.

First multiplexer 47 selects between channel data codeword P output from latch 41 and channel data codeword P* output from P* code2 ROM 45 according to the selection signal output from code2 replacement control signal generator 42, and outputs the selected codeword to third multiplexer 50.

Second multiplexer 48 selects between channel data codeword S output from latch 40 and channel data codeword S* output from S* code2 ROM 46 according to the selection signal output from code2 replacement control signal generator 42, and outputs the selected codeword to third multiplexer 50 via latch 49.

Third multiplexer 50 selects between P code output from first multiplexer 47 and an S code output from latch 49, and outputs the selected code to code1 ROM 51.

Code1 ROM 51 demodulates the input codeword sequence of 11 bits into a source data sequence of 4 bits and outputs the result.

The suggested characteristic parameters for generating a (4,20) RLL modulation code apparatus for generating RLL according to the present invention are as follows.

$$d=4, k=20 \quad \ldots (1)$$
$$m/n = 4/11 \quad \ldots (2)$$
$$Tw = Tb(4/11) \quad \ldots (3)$$
$$DR = (4 \times 5)/11$$
$$= 1.82 \quad \ldots (4)$$

Here, compliance with d is determined during the generation of code. As shown in formulas (3) and (4), the detectable window width Tw of the modulation code is decreased by 48% compared with 2/3 Tb of the conventional (1,7) RLL modulation code and the recording density ratio (DR) is increased by 37% compared with those of the conventional (1,7) RLL modulation code. Thus, higher density recording than the conventional (1,7) RLL modulation code can be performed. Also, since the code spectrum of the present invention is concentrated on the low frequency band compared with that of (1,7) RLL modulation code, the signal-to-noise ratio is higher than that of (1,7) RLL modulation code, considering that the modified trigonometric function channel of the magneto-optical disk system has a low pass filtering characteristic.

The hardware of the encoder and decoder can be easily implemented since the modulation code has a fixed codeword length, different from VFM modulation which has a variable codeword length.

While the specific embodiment disclosed herein is directed to (4,20) RLL coding, the present invention can be applied to RLL codes with different variables which also improve upon present techniques used with (1,7) RLL coding and VFM coding. For example, other sets of variables could be as indicated in the following table:

|       | d | k  | m | n |
|-------|---|----|---|---|
| VFM   | 4 | 22 | 2 | 5 |
| (1,7) | 1 | 7  | 2 | 3 |
| (2,7) | 2 | 7  | 1 | 2 |

This disclosure is related to Korean patent application No. 94-31848, filed on Nov. 29, 1994, the disclosure of which is hereby expressly incorporated herein by reference in its entirety.

What is claimed is:

1. An apparatus for generating, from source data, RLL modulation encoded data comprising a sequence of channel data bits, said sequence of channel data bits comprising transition bits separated by a minimum of four non-transition bits and a maximum of twenty non-transition bits positioned in said sequence between each and every successive pair of said transition bits, wherein a transition bit is a 1 and a non-transition bit is a 0, said apparatus comprising:

an encoder for encoding a sequence of source data bits, said encoder comprising first converter means for converting 4 bits of source data into 11 bits of channel data, to produce a sequence of 11-bit channel data;

means for storing the 11-bit channel data in a storage medium;

means for reproducing the 11-bit channel data from said storage medium; and a decoder for decoding the reproduced 11-bit channel data, said decoder comprising: second converter means for converting 11 bits of reproduced 11-bit channel data into 4 bits of source data; means for determining whether a channel data codeword of eleven bits comprises a codeword replaced according to a predetermined replacement rule; codeword replacing means for replacing a replaced code with an original codeword; and demodulating means for demodulating an 11 bit channel data codeword output from said codeword replacing means into a source data codeword having four bits.

2. The apparatus according to claim 1, wherein said codeword replacing means comprises:

a code2 replacement control signal generator for generating preceding and succeeding channel data replacement control signals for replacing the replaced codeword with an original codeword when a sequence, comprising a preceding channel data codeword output from said demodulating means and a succeeding channel data codeword output from said demodulating means immediately after said preceding channel data codeword, comprises replaced code;

a P* control signal encoder for encoding said preceding replacement control signal generated from said code2 replacement control signal generator;

an S* control signal encoder for encoding said succeeding replacement control signal generated from said code2 replacement control signal generator;

a P* code2 ROM for outputting a preceding replacement codeword P* stored at an address that corresponds to said preceding replacement control signal encoded by said P* control signal encoder;

an S* code2 ROM for outputting a succeeding replacement codeword S* stored at an address that corresponds to said succeeding replacement control signal encoded by said S* control signal encoder;

a first multiplexer for selectively outputting one of said preceding channel data codeword and said preceding replacement channel data codeword P*;

a second multiplexer for selectively outputting one of said succeeding channel data codeword and said succeeding replacement channel data codeword S*; and a third multiplexer for selectively outputting one of a channel data codeword output from said first multiplexer and a channel data codeword output from said second multiplexer.

3. An apparatus for generating, from source data, RLL modulation encoded data comprising a sequence of channel data bits, said sequence of channel data bits comprising transition bits separated by a minimum of four non-transition bits and a maximum of twenty non-transition bits positioned in said sequence between each and every successive pair of said transition bits, wherein a transition bit is a 1 and a non-transition bit is a 0, said apparatus comprising:

an encoder for encoding a sequence of source data bits, said encoder comprising: first converter means for converting 4 bits of source data into 11 bits of channel data, to produce a sequence of 11-bit channel data; modulating means for modulating four bits of said source data into a initial channel data codeword having eleven bits; means for determining when placing said initial channel data codeword within a sequence of channel data codewords will result in a data sequence having a successive pair of transition bits with less than 4 non-transition bits therebetween; and codeword replacing means for replacing said initial channel data codeword with a replaced channel data codeword when placing said initial channel data codeword within a sequence of channel data codewords will result in a data sequence having a successive pair of transition bits with less than 4 non-transition bits therebetween;

means for storing the 11-bit channel data in a storage medium;

means for reproducing the 11-bit channel data from said storage medium; and a decoder for decoding the reproduced 11-bit channel data, said decoder comprising second converter means for converting 11 bits of reproduced 11-bit channel data into 4 bits of source data.

4. The apparatus according to claim 3, wherein said codeword replacing means comprises:

a code2 replacement control signal generator for generating preceding and succeeding channel data replacement control signals for replacing said initial channel data codeword according to predetermined replacement rules when a sequence, comprising a preceding channel data codeword output from said modulating means and a succeeding channel data codeword output from said modulating means immediately after said preceding channel data codeword, does not satisfy the condition that d is equal to four.

5. The apparatus according to claim 4, wherein said codeword replacing means further comprises:

a P* control signal encoder for encoding said preceding channel replacement control signal generated from said code2 replacement control signal generator;

an S* control signal encoder for encoding said succeeding replacement control signal generated from said code2 replacement control signal generator;

a P* code2 ROM for outputting a preceding replacement codeword P* stored at an address that corresponds to said preceding replacement control signal encoded by said P* control signal encoder;

a S* code2 ROM for outputting a succeeding replacement codeword S* stored at an address that corresponds to said succeeding replacement control signal encoded by said S* control signal encoder;

a first multiplexer for selectively outputting one of said preceding channel data codeword and said preceding replacement data codeword P*;

a second multiplexer for selectively outputting one of said succeeding channel data codeword S* and succeeding replacement channel data codeword S*;

a third multiplexer for selectively outputting one of a channel data codeword output from said first multiplexer and a channel data codeword output from said second multiplexer.

6. The apparatus according to claim 4, wherein said predetermined replacement rules are defined by the following replacement table:

| previous sequence p7,p8,p9,p10,p11,s1,s2,s3 | translated sequence p*7,p*8,p*9,p*10,p*11,s*1, s 2, . . . s 11 |
|---|---|
| (1) X X 1 0 0 : 0 1 X | X X 0 0 1 : Rule I |
| (2) X X 1 0 0 : 1 X X | X X 0 1 0 : Rule II |
| (3) 0 1 0 0 0 : 1 X X | 1 0 0 0 0 : Rule III-1, III-2 | wherein pk $1 \leq k \leq 11$, represents the location of a bit forming said preceding channel data codeword, sl, $1 \leq l \leq 11$, represents the location of a bit forming said succeeding codeword, and X represents a "don't care" bit.

7. The apparatus according to claim 6, wherein Rule I, Rule II, Rule III-1, and Rule III-2 are defined as follows:

```
< Rule I >
p9, p10, p11: 1 0 0 → 0 0 1
            s1 . . . s11              s*1 . . . s*11
c5:         01000 000000      →       00001 000000
c12         01000 001000      →       00000 100000
c14         01000 000100      →       00000 010000

< Rule II >
p9, p10, p11: 1 0 0 → 0 1 0
            s1 . . . s11              s*1 . . . s*11
c6:         10000 000000      →       00010 000000
c10         10000 100000      →       00001 000000
c15         10000 001000      →       00000 100000
c16         10000 000100      →       00000 010000

<Rule III-1 > for p3=0
p7, p8, p9, p10, p11: 0 1 0 0 0 → 1 0 0 0 0
            s1 . . . s11              s*1 . . . s*11
c6:         10000 000000      →       01000 000000
c10         10000 100000      →       00100 000000
c15         10000 001000      →       00010 000000
c16         10000 000100      →       00001 000000

< Rule III-2 > for p3=1
p7, p8, p9, p10, p11: 0 1 0 0 0 → 1 0 0 0 0
            p3: 1 → 0
            s1 . . . s11              s*1 . . . s*11
c6:         10000 000000      →       10000 100000
c10         10000 100000      →       10000 010000
c15         10000 001000      →       00000 100000
c16         10000 000100      →       00000 010000.
```

* * * * *